United States Patent [19]

Golinski

[11] 3,896,541

[45] July 29, 1975

[54] METHOD AND APPARATUS FOR SUPPORTING SUBSTRATES DURING BONDING

[75] Inventor: Stanley Golinski, La Grange Park, Ill.

[73] Assignee: Western Electric Company, Inc., New York, N.Y.

[22] Filed: Sept. 16, 1974

[21] Appl. No.: 506,645

[52] U.S. Cl. .................... 228/180; 29/589; 29/626; 228/213; 228/234; 228/6

[51] Int. Cl.[2] ................ B23K 19/00; B23K 37/04; H01L 21/603

[58] Field of Search ............. 29/589, 590, 591, 626, 29/471.1, 471.3, 493; 228/4, 5, 6

[56] References Cited

UNITED STATES PATENTS

| | | | |
|---|---|---|---|
| 3,475,814 | 11/1969 | Santangini | 29/589 |
| 3,477,630 | 11/1969 | Schneider | 228/6 |
| 3,608,809 | 9/1971 | Cushman | 228/4 X |
| 3,669,333 | 6/1972 | Coucoulas | 228/4 X |
| 3,729,810 | 5/1973 | Piechocki | 29/493 |
| 3,793,710 | 2/1974 | Monahan et al. | 29/471.1 X |
| 3,811,182 | 5/1974 | Ryan, Sr. et al. | 29/589 X |

*Primary Examiner*—Al Lawrence Smith
*Assistant Examiner*—K. J. Ramsey
*Attorney, Agent, or Firm*—R. A. Lloyd

[57] ABSTRACT

A support for a substrate to have beam-leaded integrated circuit (IC) chips thermocompression bonded thereto includes a pair of horizontal plates maintained in a spaced, overlapping relationship with each other. The substrate is carried over the upper surface of the upper plate, and a plurality of cylindrical supports are constrained for sliding movement through the plates. An upper end of each support is positioned beneath an associated individual one of the IC chip bond sites on an upper surface of the substrate, and is normally flush to below flush with the upper surface of the upper plate. The upper plate is heated to conductively heat the upper end of each cylindrical support, and a stationary cam is positioned beneath the lower plate, essentially coaxial with an IC chip bonding device above the upper plate. Movement of the plates and substrate to position a selected bond site beneath the bonding device engages a lower end of the pedestal associated with that bond site with the cam to slidably elevate the pedestal to move the upper end thereof above flush with the upper surface of the upper plate and into engagement with a lower surface of the substrate. This provides a localized heated support for the bonding site thereabove so that an IC chip may be thermocompression bonded thereto.

12 Claims, 4 Drawing Figures

METHOD AND APPARATUS FOR SUPPORTING SUBSTRATES DURING BONDING

BACKGROUND OF THE INVENTION

1. Field of the Invention

The present invention relates to thermocompression bonding supports for substrates, and in particular to a thermocompression bonding support wherein a plurality of cylindrical supports, each associated with an individual one of a plurality of bond sites on a substrate, are individually and selectively actuated to provide localized support for the substrate beneath its associated bond site.

2. Description of the Prior Art

In thermocompression bonding conductive leads, or the leads of beam-leaded integrated circuit (IC) chips, to conductors at bond sites on a surface of a ceramic substrate, the substrate must be supported on its opposite surface by a base having some means for compensating for waviness or variations in thickness of the substrate to protect the substrate against cracking during the bonding of an IC chip thereto. One such base is disclosed in U.S. Pat. No. 3,729,810, which issued on May 1, 1973, to B. Piechocki, and is assigned to the assignee of the present invention, wherein a plurality of cantilever spring elements, attached to a common, rigid support, form a compensating support for a substrate. The substrate is supported on the ends of the spring elements, with the end of each spring element supporting an area of the substrate beneath an individual one of the bond sites, and conductive leads are simultaneously thermocompression bonded to conductors at all of the bond sites. During the bonding operation, each spring element is deflected an amount determined by the thickness and waviness of the substrate to apply a uniform pressure to the substrate, beneath the bond sites, to protect the substrate against cracking.

Another type of base for supporting a substrate is disclosed on U.S. Pat. No. 3,608,809, issued on Sept. 28, 1971, to R. H. Cushman, and also assigned to the assignee of the present invention, wherein a viscous medium, sealed in a flexible diaphram, provides a compensating support base for a substrate. In this case, the substrate is carried on the diaphram, and IC chips are simultaneously thermocompression bonded to conductors at all of the bond sites distributed across the substrate. During bonding, the diaphram flexes to compensate for substrate irregularities, and the viscous medium distributes the bonding pressure across the diaphram to apply uniform bonding pressure at each bonding site to protect the substrate against cracking.

In both of the above patents, all of the conductive leads or all of the beam-leaded IC chips are simultaneously bonded to conductors at all of the bond sites on the substrate, and the compensating support bases simultaneously support the substrate at points beneath all of the bond sites. While such bases are quite useful where there is simultaneous bonding to all of the bond sites distributed across a surface of a substrate, they are of no value where bonds are to be effected one at a time to selected individual bond sites at localized areas on the surface. In such a case, the bases would actually enhance cracking of the substrate as the substrate moves, under the action of a bonding device at the selected bond site, by resisting movement of the substrate at other bond sites.

A known base for a substrate, which provides compensating support thereto during the thermocompression bonding of an IC chip to a single bond site at a localized area on a surface thereof, is a single, heated, pedestal-type support, which engages and supports the substrate only at an area beneath the bond site. In this case, the pedestal is positioned beneath the substrate, coaxial with a bonding device thereabove, and the substrate is moved with respect to the bonding device and the pedestal to position a selected bond site beneath the bonding device and above the pedestal. During the bonding operation, the pedestal engages the surface of the substrate beneath the bond site to facilitate the bonding by heating the site and to protect the substrate against cracking, under the pressure of the bonding device, by supporting the substrate beneath the bond site.

The single pedestal-type compensating support, while protecting the substrate against cracking while an IC chip is thermocompression bonded to a single bond site thereon, has certain disadvantages. For example, the back surface of the substrate which is engaged by the pedestal, opposite from the bond sites, ordinarily has a plating thereon which forms a common return circuit. If the upper end of the pedestal is continuously maintained in contact with this surface, then when the substrate is translated to position a bond site thereabove the upper end of the pedestal slides across the plated surface and scratching of the plating may occur which could render the resulting circuit unsuitable for use. Alternatively, if the pedestal and substrate are separated during translation of the substrate to prevent the plating on the substrate from being scratched, then a mechanical mechanism is required to either move the substrate out of contact with the pedestal, or the pedestal out of contact with the substrate, during translation of the substrate. This ordinarily involves complex mechanical mechanisms and motions, and if it is the substrate that is moved out of contact with the pedestal, then the danger exists during movement of the substrate that the planar orientation between the substrate bond sites and the bonding device will be lost, resulting in the possibility of a weak bond of an IC chip to the substrate or in the cracking of the substrate.

A further disadvantage to the single pedestal-type compensating support is the time required to reheat the pedestal to a predetermined temperature after each bonding operation, since during the bonding operation a portion of the heat stored in the support is transferred to the substrate. Reheating a support typically requires about six seconds, and where a substantial number of bonds are to be made, considerable additional time, and therefore expense, is added to the bonding operation.

SUMMARY OF THE INVENTION

In accordance with the present invention, an apparatus for supporting a first article, which is translated to sequentially position selected bond sites on a first surface thereof at a bonding location, during bonding of second articles to the bond sites at the bonding location, includes a plurality of supports, each associated with an individual one of the bond sites and movable in directions toward and away from an area on a second surface of the first article opposite from both the first surface thereof and its associated bond site thereon. Also included is a cam, operative upon the first article being translated to position a selected bond site at the bonding location, for moving the support associated with that bond site toward the second surface and into engagement with the area thereof opposite from the bond site to support the first article thereat.

Preferably, the apparatus is for supporting a substrate, having an array of bond sites on a first surface thereof which are sequentially positioned upon translation of the substrate at a bonding location for having circuit elements bonded thereto, at an area on a second surface of the substrate opposite from the first surface and from the bond site at the bonding location. The apparatus includes first and second apertured plates secured in a spaced and parallel relationship with each other and with the substrate for movement therewith, with the first plate positioned between the second surface and the second plate. The apertures in each plate are in an array which spatially corresponds with the array of bond sites on the substrate with lines through the bond sites and perpendicular to the second surface each defining the axis of an individual pair of apertures, one aperture of each pair being in the first plate and the other aperture of each pair being in the second plate. A plurality of elongated support members, having first and second ends, are each slidably extended through an individual one of the pairs of apertures for movement along the axis thereof toward and away from an associated bond site, with the first end of each member extended through the first plate and normally spaced from the second surface of the substrate, and with the second end thereof extending through and from the second plate. A plurality of collars are each positioned around individual ones of the elongated members at a position thereof between the first and the second plates to secure the members slidably within the plates.

A cam, having a sloping surface, is positioned for engaging and for moving the second end of an elongated member toward the second surface of the substrate, as the member is moved with the substrate to position the bond site associated therewith at the bonding location, to move the first end of the member against an area on the second surface opposite from the bond site when the bond site is at the bonding location to support the substrate thereat during bonding of a circuit element to the bond site. A heating element heats the first plate to conductively heat the first end of each elongated member slidably extended therethrough to heat the bond site associated with the member by thermal conduction through the substrate when the member engages the second surface thereof.

DETAILED DESCRIPTION

Figure 1:
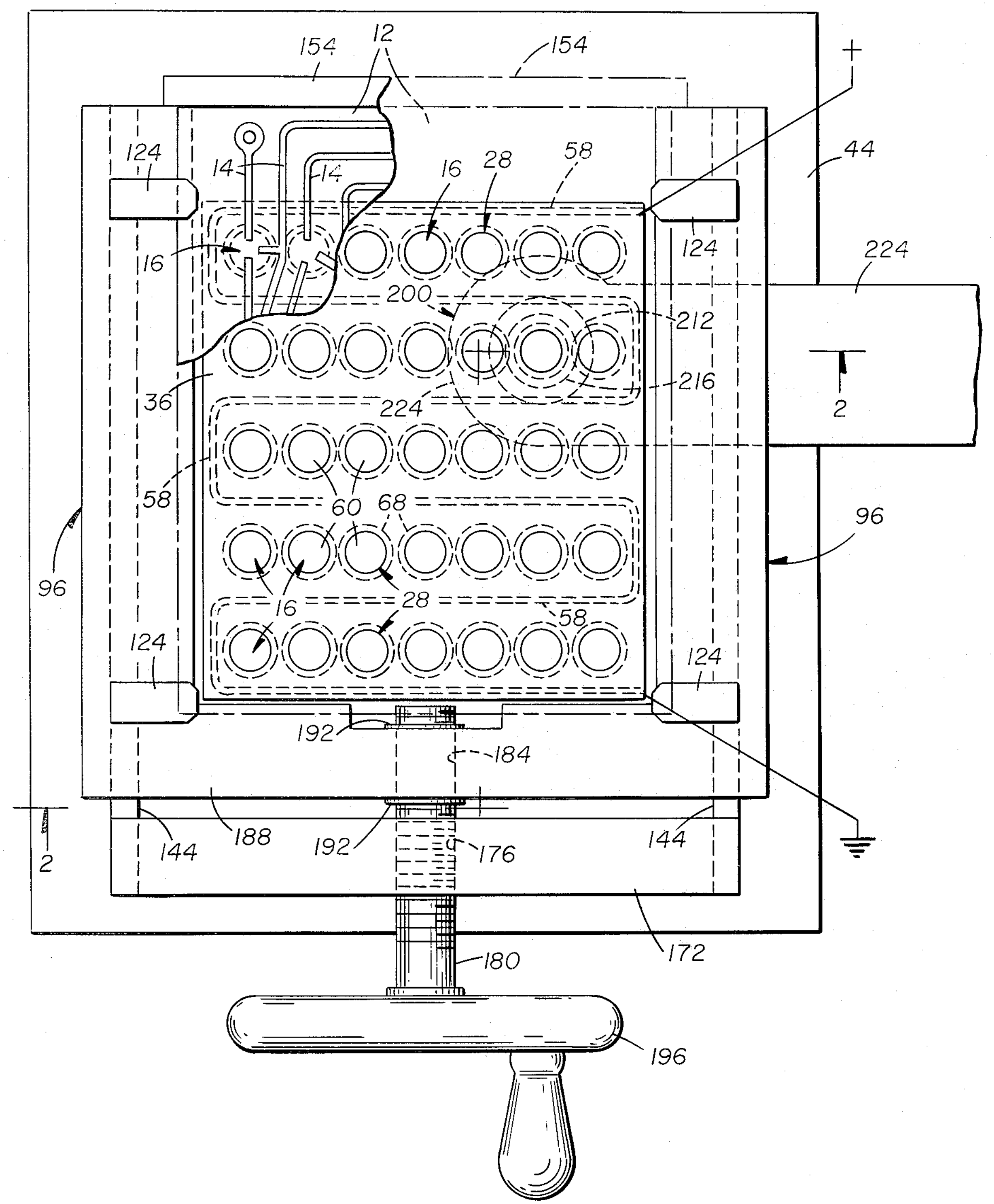
FIG. 1 is a partially fragmented top view of an apparatus embodying the principles of the present invention, showing a substrate carried above a plurality of individual supports positioned beneath bond sites on the substrate.

The apparatus of the invention as illustrated in the drawings, for supporting a ceramic substrate 12, or other first article, during thermocompression bonding of beam-leaded integrated circuit (IC) elements, or other second articles, to conductors 14 at bond sites 16 on an upper surface 20 thereof, which are sequentially positioned at a bonding location beneath a bonding tool 24, includes a plurality of cylindrical, or pedestal-type, supports 28. Each support 28 is associated with an individual one of the bond sites 16, and is selectively moved against a localized area of a lower surface 32 of the substrate, opposite from its associated bond site, when its associated bond site is at the bonding location. This holds the substrate 12 against deflection when a circuit element is thermocompression bonded to the bond site 16 at the bonding location to prevent the substrate from cracking.

Figure 2:
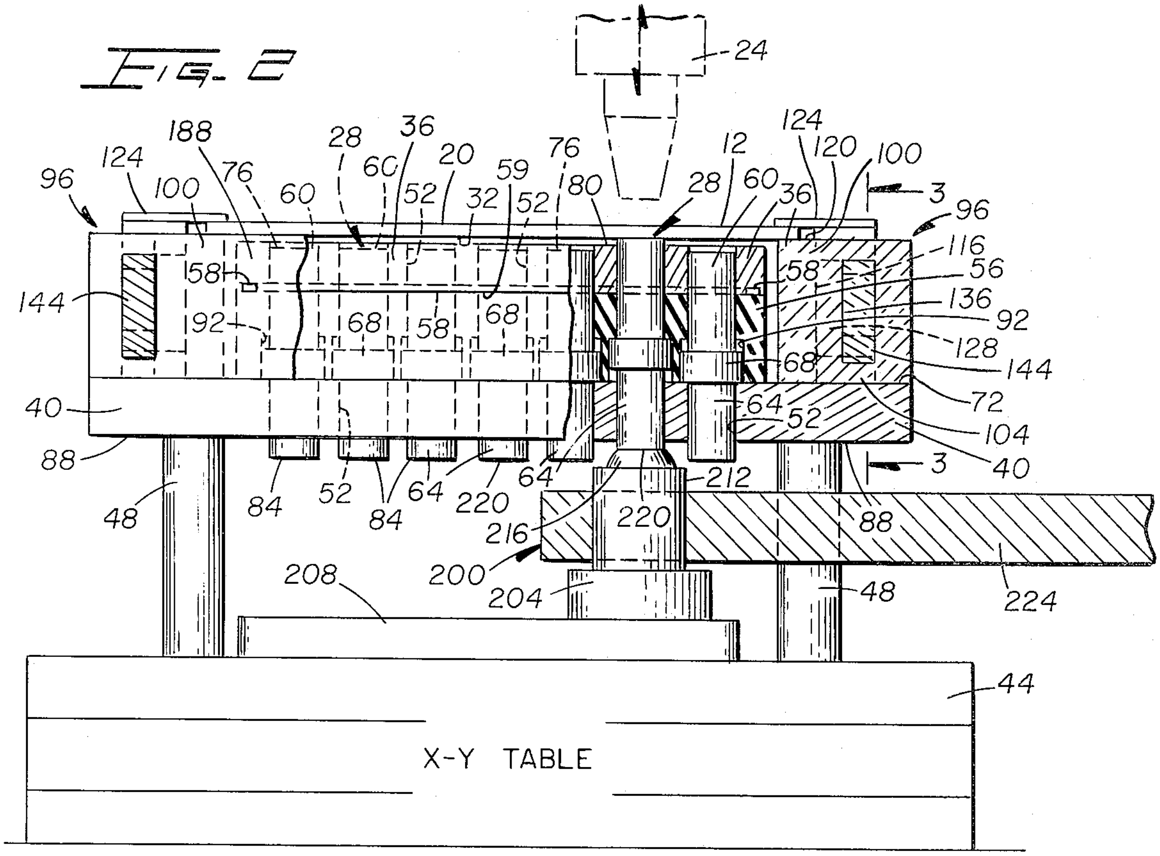
FIG. 2 is a view taken along the line 2—2 of FIG. 1, and shows the manner in which the supports are individually actuated to support the substrate.

More particularly, with reference to FIGS. 1 and 2, a pair of essentially rectangular plates 36 and 40 are secured horizontally in a parallel and spaced relationship with each other. The lower plate 40 is supported on an *x, y* table 44 by four posts 48, one at each of its corners, for movement therewith. Each plate 36 and 40 has a plurality of apertures 52 formed therein, with the apertures in each plate being in an array which spatially corresponds with the array of bond sites 16 on the surface 20 of the substrate 12, such that when the substrate 12 is positioned above the plates 36 and 40, as shown in FIG. 2, lines through the bond sites 16 on the substrate 12, and perpendicular to the lower surface 32 of the substrate, each define the center line, or axis, of an individual pair of apertures 52, one aperture of each pair being in the upper plate 36 and the other aperture of each pair being in the lower plate 40.

The plates 36 and 40 may be maintained in their spaced and parallel relationship by any suitable means, such as by posts extended therebetween or, preferably, by a spacer plate 56 positioned therebetween and having apertures formed therethrough which extend between and are coaxial with the pairs of apertures formed in the plates 36 and 40. A resistance heating element 58 is positioned in a groove formed in a lower surface 59 of the upper plate 36, and is connected across a source of voltage to heat the upper plate 36.

Each pedestal support 28 is defined by an upper cylindrical portion 60 and a lower cylindrical portion 64, which are coaxial and contiguous. Each support 28 is associated with an individual one of the pairs of apertures 52, and the upper cylindrical portion 60 of the support is slidably extended through and coaxial with the aperture of the pair in the plate 36, for being conductively heated thereby, and the lower cylindrical portion 64 is slidably extended through and coaxial with the aperture of the pair in the plate 40. A collar 68 is secured around each support 28 at the juncture of the cylindrical portions 60 and 64 between the plates 36 and 40, which constrains the support for sliding movement along its axis and within the pair of apertures. The lengths of the upper and the lower cylindrical portions 60 and 64 of each support 28 are such that when the collar 68 of the support rests upon an upper surface 72 of the plate 40, an end 76 of the upper cylinder 60 is approximately level with an upper surface 80 of the plate 36, while an end 84 of the lower cylinder 64 extends beyond a lower surface 88 of the plate 40. As shown, with the spacer plate 56 between the plates 36 and 40, the cylindrical portion 60 of each support 28 also slidably extends through the aperture formed in the plate 56, and a cavity 92 is formed in the plate adjacent to the plate 40 and around the collar 68 to accommodate the collar and to permit upward movement thereof when, as will be described, the support 28 is slidably elevated through its associated pair of apertures in the plates 36 and 40.

The substrate 12 is carried above the ends 76 of the cylindrical supports 28 by any suitable device, such as by two identical clamping mechanisms 96. The mechanisms 96 are each arranged to clamp an associated opposite edge of the substrate 12 along the length thereof, and to support the substrate parallel to the plate 36 and in a spaced relationship from both the upper surface 80 thereof and the ends 76 of the supports 28, with the bond sites on the surface 20 of the substrate 12 each positioned along the axis of an associated support 28.

As each clamping mechansim 96 is identical, only one of the clamping mechanisms will be described, it being understood that the description thereof aptly applies to the other one of the clamping mechanisms. The clamping mechanism includes, with particular reference to FIGS. 2 and 3, two L-shaped members 100 and 104, connected to form a rectangular housing having a rectangular passageway 116 extending there-through. The members 100 and 104 are mounted on an edge of the plate 40 which extends beyond the edge of the plate 36, and extend parallel to an associated clamped edge of the substrate 12 for supporting the edge on an upper surface 120 of the member 100.

To secure the substrate 12 to the surface 120 of the member 100, and above the ends 76 of the cylindrical, or pedestal supports 28, clamping arms 124 are arranged to be selectively moved into pressing engagement with the upper surface 20 of the substrate 12 at points overlying the surface 120 of the member 100. In the present invention, each clamping mechanism 96 includes two clamping arms 124, and movement thereof into engagement with the surface 20 of the substrate 12 is accomplished by securing each clamping arm 124 to the upper end of a follower 128 which is slidably extended into the rectangular passageway 116 through an aperture 132 formed in the upper portion of the member 100. The follower 128 has a U-shaped formation 136 at the lower end thereof, within the passageway 116, which extends around, and accommodates therewithin, a cam portion 140 of a slider 144. The slider 144 extends lengthwise through the passageway 116 for movement therewithin, and upon movement of the slider in the direction of the arrow in FIG. 4, a sloping surface 148 of the cam portion 140 engages an upper leg 152 of the U-shaped formation 136 of the follower 128 to elevate the follower 128. This moves the clamping arms 124 away from the surface 120 of the member 100 to allow the substrate 12 to be positioned with opposite edges thereof resting upon the surfaces 120 of the members 100. Ordinarily, the substrate 12 has a terminal strip 154 attached to an edge thereof, and in positioning the substrate upon the surfaces 120 the terminal strip is brought into abutting engagement with the ends of the clamping mechanisms 96 to orient the bond sites 16 on the surface 20 over the ends 76 of their associated supports 28.

With the substrate positioned on the surface 120, movement of the slider 144 in the opposite direction then engages a lower leg 156 of the U-shaped formation 136 with a sloping surface 160 of the cam portion 140 to move the follower 128 downwardly into the passageway 116. This moves the clamping arms 124 into engagement with the upper surface 20 of the substrate 12 to secure the substrate to the surface 120.

Figures 3, 4:
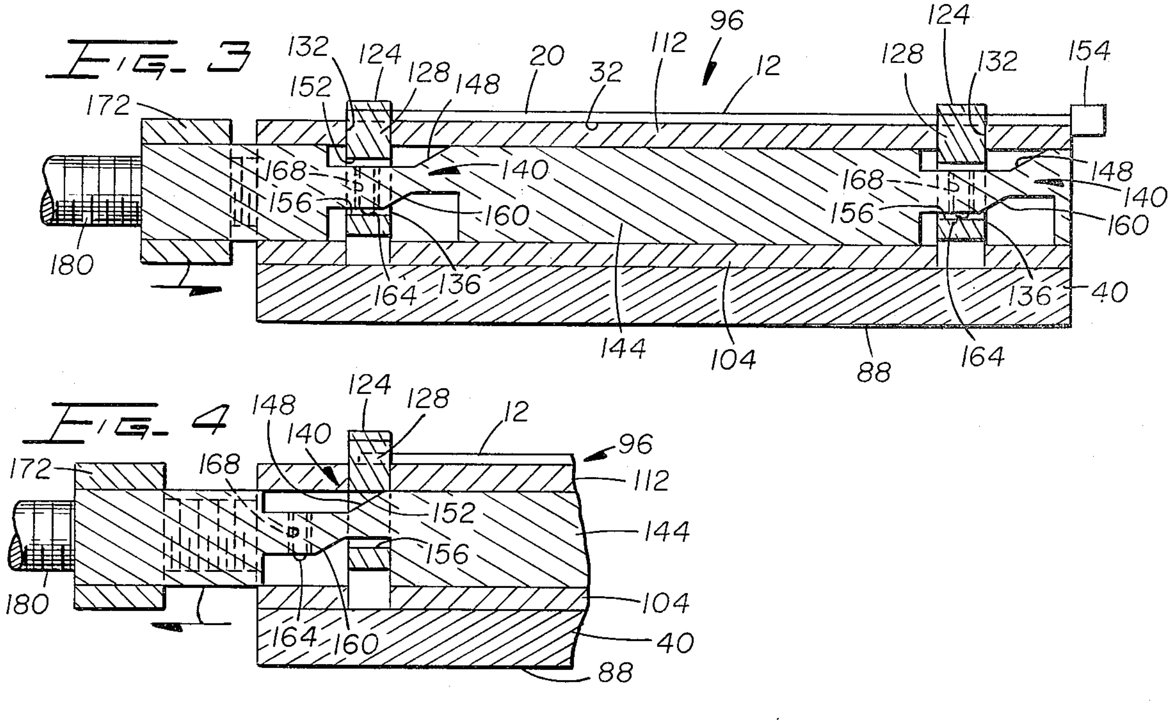
FIG. 3 is a view taken along the line 3—3 of FIG. 2, and illustrates a mechanism, in the clamping position, for securing the substrate above the supports.
FIG. 4 shows a portion of the mechanism of FIG. 3 in the unclamped position.

To both ensure that the substrate is clamped by the clamping arms 124 in the event that the substrate has a thickness less than a nominal value, and to prevent the substrate from being cracked thereby in the event that the substrate has a thickness in excess of the nominal value, a spring loaded ball 164 is positioned within a passageway 168 in the cam portion 140 of the slider 144 to engage the lower leg 156 of the U-shaped formation 136 when the slider is moved in the direction of the arrow as shown in FIG. 3. This compensates for variations in thickness of the substrate and applies a resilient downward force against the follower 128 to resiliently hold the clamping arm 124 against the substrate 12.

To simultaneously move the sliders 144 of the clamping devices 96, a bar 172, having a threaded passageway 176 therein, is connected at each of its ends to an end portion of an individual one of the sliders 144. A threaded shaft 180 extends through and is threadably engaged within the passageway 176, and is captivated at a nonthreaded end thereof within a passageway 184, formed in a cross-member 188 secured at each of its ends to an individual one of the clamping devices 96, with a pair of collars 192. A crank 196 is secured to the opposite end of the shaft 180 and is rotatable in either direction to simultaneously move both slider mechanisms 144 in a selected direction, through the action of the threads on the shaft 180 on the threads within the passageway 176, to engage or to disengage the clamping arms 124 with the substrate 12.

In bonding circuit elements to bond sites 16 on the surface 20 of the substrate 12, with the substrate supported by the clamping devices 96 over the plate 36, and with the bond sites on the surface 20 thereof positioned above the ends 76 of their associated supports 28, the *x*, *y* table 44 is actuated to translate the substrate and to successively position individual ones of the bond sites at a bonding location beneath the bonding tool 24 for having an IC element bonded thereto. The bonding tool 24 may be any conventional thermocompression bonding tool, and is restrained for movement along its bonding axis, in the direction shown by the arrows in FIG. 2, toward and away from a bonding location which lies along its axis of movement.

To support the substrate 12 against cracking while a circuit element is bonded to a bond site positioned at the bonding location, a cam 200 is positioned beneath the lower surface 88 of the plate 40, and in alignment with the axis of movement of the bonding tool 24. The cam 200 includes a base 204 which slidably rests on a plate 208, which in turn is secured to the *x*, *y* table 44, and a cylindrical section 212 which is secured to the base portion 208. A cam surface 216 is formed on top of the cylindrical section 212, in alignment with the axis of movement of the bonding tool 24.

The cam 200 is maintained in alignment with the axis of movement of the bonding tool 24 during movement of the *x*, *y* table 44 by securing the cam to one end of an arm 224, which extends through and externally of the posts 48, the other end of which is secured externally of the apparatus of the invention and is independent of movement thereof. In this manner, as the *x*, *y* table 44 is actuated to translate the substrate 12 and the supports 28 to position successive bond sites at the bonding location, the cam 200 slides on a bearing surface formed between the base 204 and the upper surface of the plate 208, and remains in alignment with the axis of movement of the bonding tool 24.

The lower ends 84 of the supports 28 depend lower than the upper surface of the cam surface 216. As a result, when a substrate 12 and the supports 28 are moved to position a selected bond site 16 at the bonding location, the lower end 84 of the support 28 associated with that bond site engages the cam surface 216, as the bond site nears the bonding location, and is elevated by the cam surface as the bond site is moved to the bonding location. This elevates the support through the plates 36 and 40 and the plate 56, and moves the upper end 76 thereof into engagement with an area of the surface 32 of the substrate 12 beneath the bond site 16 at the bond location. At this point, the bond site 16 at the bonding location, the axis of the support 28 associated therewith, and the cam 200 all lie along the axis of movement of the bonding tool 24. Then, during the bonding of a circuit element to the bond site, the support 28, extended between the surface 32 of the substrate 12 and the cam 200, provides localized rigid support to the substrate immediately beneath the bond site. In an identical manner, as successive bond sites 16 are positioned at the bonding location the cylindrical supports 28 associated therewith are successively engaged at the ends 84 thereof by the cam surface 216 of the cam 200, and are slidably elevated through the plates 36 and 40, through the spacer plate 56, and into engagement with an area of the substrate beneath their associated bond site at the bonding location to provide localized support thereto during a subsequent bonding operation. In other words, as bond sites on the substrate are successively positioned at the bonding location, the supports associated therewith are selectively actuated into engagement with the surface of the substrate underlying the bond site.

As previously mentioned, the upper plate 36 is heated by a resistance heating element 58, and in turn heats the upper cylindrical portions 60 of the supports 28. When the upper end 76 of the cylindrical portion 60 is brought into supporting engagement with the surface 32 of the substrate 12 beneath a bond site 16 at the bonding location, the portion 60 heats the substrate at the point of contact, which heat is conductively transferred through the substrate to heat the bond site at the bonding location. In thermocompression bonding, such preheating of a bond site is not necessary, but is desirable and enhances a resulting bond.

While one particular embodiment of the invention has been described in detail, it is understood that various other modifications and embodiments may be devised by one skilled in the art without departing from the spirit and scope of the invention.

What is claimed is:

1. In an apparatus for supporting a first article, which is moved to sequentially position selected bond sites on a first surface thereof at a bonding location, during bonding of second articles to the bond sites at the bonding location:

a plurality of supports, each associated with an individual one of the bond sites and movable in directions toward and away from an area on a second surface of the first article opposite from both the first surface thereof and its associated bond site thereon, and means, operative upon the positioning of a selected bond site at the bonding location, for moving the support associated with that bond site toward the second surface and into engagement with the area thereof opposite from the bond site to support the first article thereat.

2. In an apparatus for supporting a substrate, having an array of bond sites on a first surface thereof which are sequentially positioned upon movement of the substrate at a bonding location for having circuit elements bonded thereto, at an area on a second surface thereof opposite from the first surface and from the bond site at the bonding location:

first and second apertured plates secured in a spaced and parallel relationship with each other and with the substrate for movement therewith, with the first plate positioned between the second surface and the second plate, the apertures in each plate being in an array which spatially corresponds with the array of bond sites on the substrate with lines through the bond sites and perpencidular to the second surface each defining the axis of an individual pair of apertures, one aperture of each pair being in the first plate and the other aperture of each pair being in the second plate;

a plurality of elongated support members, having first and second ends, each slidably extended through an individual one of the pairs of apertures for movement along the axis thereof toward and away from an associated bond site, with the first end of each member extended through the first plate and normally spaced from the second surface of the substrate, and with the second end thereof extending through and from the second plate, and means, operative upon movement of the substrate to position a bond site at a bonding location, for moving the support member associated therewith toward the bond site to move the first end thereof into engagement with an area on the second surface of the substrate opposite from the bond site for supporting the substrate during bonding of a circuit element to the bond site.

3. In an apparatus as set forth in claim 2, wherein the means for moving the support member includes:

a cam, having a sloping surface positioned for engaging and for moving the second end of an elongated member toward the second surface of the substrate, as the member is moved with the substrate to position the bond site associated therewith at the bonding location, to move the first end of the member against an area on the second surface opposite from the bond site when the bond site is at the bonding location.

4. In an apparatus as set forth in claim 3, further including:

a plurality of collars, each positioned around individual ones of the elongated members at a position thereof between the first and the second plates, to secure the members slidably within the plates, and means for heating the first plate to conductively heat the first end of each elongated member slidably extended therethrough.

5. In an apparatus for assembling first articles to bond sites on a first surface of a second article with a bonding tool:

means for moving the second article to successively position individual ones of the bond sites at a bonding location for having a first article bonded thereto by the bonding tool;

a plurality of supports, normally spaced from a second surface of the second article opposite from the first surface, each associated with an individual one of the bond sites and positioned for movement against the second surface at a point opposite from its associated bond site, and means, operative upon the positioning of a bond site at the bonding location, for moving the support associated therewith against the second surface at the point opposite from the site to support the second article thereat while a first article is bonded to the site.

6. In an apparatus for bonding first articles to bond sites on a first surface of a second article with a bonding tool which moves individual ones of the first articles along a bonding axis and against a bond site positioned at a bonding location lying along the bonding axis:

means for moving the second article to successively position individual ones of the bond sites at the bonding location for having a first article bonded thereto by the bonding tool;

first and second spaced and overlapping apertured plates positioned in planes parallel to a second surface of the second article for movement therewith, opposite from the first surface, with the first plate spaced from the second surface and positioned between the second surface and the second plate, the apertures in the plates lying along lines extending perpendicular to the second surface at points opposite the bond sites on the first surface;

a plurality of elongated members, each slidably extended through an aperture in the first and the second plate along the line extending perpendicular to the second surface at a point opposite an associated bond site, and each having a first end extending toward the second surface and normally spaced therefrom, and a second end extending away from the second surface and beyond the second plate, and means, operative upon the positioning of a bond site on the first surface of the second article at the bonding location, for engaging the second end of the elongated member associated therewith to slide the member within the first and the second plates to move the first end of the member into engagement with the second surface opposite the bond site to support the second article when the bonding tool moves a first article against the bond site.

7. In an apparatus as set forth in claim 6, wherein the means for engaging the second end of the elongated member includes:

a cam, positioned opposite the second plate and along the bonding axis, for engaging and moving the second end of the elongated member, as the bond site associated therewith is moved to the bonding location, to move the first end thereof against the second surface.

8. In an apparatus as set forth in claim 7, further including:

means for heating the first end of each elongated member to heat the bond sites associated therewith when the first end is moved into engagement with the second surface of the second article.

9. In a method of supporting a first article, which is moved to sequentially position individual ones of a plurality of bond sites on a first surface thereof at a bonding location, during the bonding of second articles to the bond sites at the bonding location:

positioning individual ones of a plurality of supports in a spaced relationship with a second surface of the first article opposite from both the first surface and from an associated bond site thereon, and moving the support associated with a bond site at the bonding location into engagement with the second surface of the first article opposite from the bond site at the bonding location while maintaining the remaining supports in the spaced relationship with the second surface.

10. In a method of supporting a substrate, with individual ones of a plurality of cylindrical supports, during the thermocompression bonding of circuit elements to an array of bond sites on a first surface of the substrate which are sequentially positioned at a bonding location:

positioning the cylindrical supports in a spaced relationship with a second surface of the substrate, opposite from the first surface, with each axis thereof extending perpendicular to the second surface and through an individual one of the bond sites associated therewith;

simultaneously moving the substrate and the cylindrical supports to sequentially position individual ones of the bond sites at the bonding location and to maintain the axis of each support extending perpendicular to the second surface and through its associated bond site, and moving the cylindrical support associated with a bond site at the bonding location along its axis and into engagement with the second surface of the substrate opposite from the bond site to support the substrate thereat while a circuit element is thermocompression bonded to the bond site, while maintaining all of the remaining cylindrical supports in the spaced relationship with the second surface.

11. In the method as set forth in claim 10, wherein a first end of each cylindrical support extends toward the second surface and a second end extends away from the second surface, wherein the step of moving the support into engagement with the second surface includes:

engaging the second end of the support upon the translation thereof as the substrate is moved to position the bond site associated therewith at the bonding location to move the second end of the support along the axis thereof toward the second surface an amount sufficient to move the first end of the support into engagement with the second surface opposite from the bond site.

12. In a method as set forth in claim 11, further including:

heating the first end of each cylindrical support to heat the bond sites associated therewith by thermal conduction through the substrate when the supports engage the second surface thereof.

* * * * *